United States Patent
Cho et al.

(10) Patent No.: US 8,928,150 B2
(45) Date of Patent: Jan. 6, 2015

(54) MULTI-CHIP PACKAGE AND METHOD OF MANUFACTURING THE SAME

(71) Applicant: Samsung Electronics Co., Ltd., Suwon-si, Gyeonggi-do (KR)

(72) Inventors: Moon-Gi Cho, Hwasung (KR); Sun-Hee Park, Hwasung (KR); Hwan-Sik Lim, Hwasung (KR); Yong-Hwan Kwon, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/889,338

(22) Filed: May 7, 2013

(65) Prior Publication Data
US 2014/0015145 A1 Jan. 16, 2014

(30) Foreign Application Priority Data
Jul. 10, 2012 (KR) .................. 10-2012-0075039

(51) Int. Cl.
| | |
|---|---|
| H01L 23/48 | (2006.01) |
| H01L 23/522 | (2006.01) |
| H01L 21/768 | (2006.01) |
| H01L 23/498 | (2006.01) |
| H01L 23/538 | (2006.01) |
| H01L 23/31 | (2006.01) |
| H01L 21/56 | (2006.01) |
| H01L 21/683 | (2006.01) |
| H01L 23/00 | (2006.01) |
| H01L 25/065 | (2006.01) |
| H01L 25/00 | (2006.01) |

(52) U.S. Cl.
CPC ...... *H01L 23/5226* (2013.01); *H01L 21/76879* (2013.01); *H01L 23/49816* (2013.01);

(Continued)

(58) Field of Classification Search
USPC .......................................... 257/774
See application file for complete search history.

(56) References Cited

U.S. PATENT DOCUMENTS 7,589,410 B2 * 9/2009 Kim ........................... 257/686
2006/0087044 A1 4/2006 Goller (Continued)

FOREIGN PATENT DOCUMENTS

KR 20100047540 A 5/2010
KR 100997791 B1 12/2010

*Primary Examiner* — Thao P Le
(74) *Attorney, Agent, or Firm* — Renaissance IP Law Group LLP

(57) ABSTRACT

A multi-chip package may include first and second semiconductor chips, an insulating layer structure and a plug structure. The first semiconductor chip may include a first bonding pad. The second semiconductor chip may be positioned over the first semiconductor chip. The second semiconductor chip may include a second bonding pad. The insulating layer structure may cover side surfaces and at least portions of upper surfaces of the semiconductor chips. The plug structure may be formed in the insulating layer structure by a plating process. The plug structure may be arranged spaced apart from side surfaces of the semiconductor chips to electrically connect the first bonding pad and the second bonding pad with each other. A third semiconductor chip having a third bonding pad may be positioned over the second semiconductor chip. Thus, a process for forming a micro bump between the plugs need not be performed.

5 Claims, 22 Drawing Sheets

(52) U.S. Cl.
CPC ........ *H01L 23/5389* (2013.01); *H01L 23/3114* (2013.01); *H01L 21/561* (2013.01); *H01L 21/6835* (2013.01); *H01L 24/24* (2013.01); *H01L 24/96* (2013.01); *H01L 25/0657* (2013.01); *H01L 25/50* (2013.01); *H01L 24/73* (2013.01); *H01L 24/82* (2013.01); *H01L 24/92* (2013.01); *H01L 21/568* (2013.01); *H01L 2221/68381* (2013.01); *H01L 2224/0401* (2013.01); *H01L 2224/04105* (2013.01); *H01L 2224/12105* (2013.01); *H01L 2224/16225* (2013.01); *H01L 2224/32145* (2013.01); *H01L 2224/73267* (2013.01); *H01L 2225/06517* (2013.01); *H01L 2924/15311* (2013.01); *H01L 2924/18162* (2013.01); *H01L 2225/06565* (2013.01); *H01L 2225/06524* (2013.01); *H01L 2224/83005* (2013.01); *H01L 2224/02379* (2013.01); *H01L 2224/82106* (2013.01); *H01L 2224/24147* (2013.01); *H01L 2224/821* (2013.01); *H01L 24/13* (2013.01); *H01L 2224/05548* (2013.01); *H01L 2224/05567* (2013.01); *H01L 2224/11462* (2013.01); *H01L 2224/13022* (2013.01); *H01L 2224/13024* (2013.01); *H01L 2224/13082* (2013.01); *H01L 2224/24011* (2013.01); *H01L 2224/24051* (2013.01); *H01L 2224/73209* (2013.01); *H01L 2224/82005* (2013.01); *H01L 2224/92244* (2013.01); *H01L 2224/96* (2013.01); *H01L 2224/97* (2013.01)
USPC ........................................................ 257/774

(56) References Cited

U.S. PATENT DOCUMENTS

| | | |
|---|---|---|
| 2008/0136004 A1 | 6/2008 | Yang et al. |
| 2008/0157312 A1 | 7/2008 | Yang et al. |
| 2009/0008762 A1 | 1/2009 | Jung |
| 2009/0014876 A1 | 1/2009 | Youn et al. |
| 2009/0039491 A1 | 2/2009 | Kim et al. |
| 2010/0117218 A1 | 5/2010 | Park et al. |
| 2011/0177654 A1 | 7/2011 | Lee et al. |
| 2011/0304056 A1 | 12/2011 | Lee et al. |
| 2011/0309496 A1 | 12/2011 | Wang et al. |
| 2011/0309504 A1 | 12/2011 | Bae et al. |
| 2011/0316159 A1* | 12/2011 | Kang et al. .............. 257/741 |

* cited by examiner

MULTI-CHIP PACKAGE AND METHOD OF MANUFACTURING THE SAME

CROSS-RELATED APPLICATION

This application claims priority under 35 USC §119 to Korean Patent Application No. 10-2012-0075039, filed on Jul. 10, 2012 in the Korean Intellectual Property Office (KIPO), the contents of which are herein incorporated by reference in their entirety.

BACKGROUND

1. Field

Example embodiments relate to a multi-chip package and a method of manufacturing the same. More particularly, example embodiments relate to a multi-chip package having sequentially stacked semiconductor chips, and a method of manufacturing the multi-chip package.

2. Description of the Related Art

Generally, semiconductor fabrication processes may be performed on a semiconductor substrate to form semiconductor chips. In order to mount each of the semiconductor chips on a main board, a packaging process may be performed on the semiconductor chip to form a semiconductor package.

In order to increase storage capacity of the semiconductor package, a multi-chip package including sequentially stacked semiconductor chips may be widely developed. An electrical connecting member such as a conductive wire, a plug, a conductive bump, etc., may be used for electrically connecting the stacked semiconductor chips with each other. In the multi-chip package having the plugs, the plugs may be connected with each other using a micro bump.

However, the micro bump is formed using complicated processes including attaching the semiconductor chip to a supporting substrate using an adhesive, and detaching the semiconductor chip from the supporting substrate.

Further, the adhesive including an insulating material may partially remain on the micro bump. The remaining adhesive may electrically disconnect the micro bump from the plug. Additionally, the micro bump may be formed by a reflow process, which is complicated and expensive.

Accordingly, an improved multi-chip package and associated manufacturing process is needed. Embodiments of the present inventive concepts address these and other limitations in the prior art.

SUMMARY

Example embodiments provide a multi-chip package that may be manufactured using a simple process and at a low cost. Example embodiments also provide a method of manufacturing the multi-chip package.

According to some example embodiments, a multi-chip package is provided. The multi-chip package may include a first semiconductor chip, a second semiconductor chip, an insulating layer structure and a plug structure. The first semiconductor chip may include a first bonding pad. The second semiconductor chip may be positioned over the first semiconductor chip. The second semiconductor chip may include a second bonding pad. The insulating layer structure may be configured to cover side surfaces and at least portions of upper surfaces of the first semiconductor chip and the second semiconductor chip. The plug structure may be formed in the insulating layer structure by a plating process. The plug structure may be arranged spaced apart from the side surfaces of the first semiconductor chip and the second semiconductor chip to electrically connect the first bonding pad and the second bonding pad with each other.

In example embodiments, the plug structure may include a first seed layer, a first plug, a second seed layer, a first redistribution layer, a second plug, a third seed layer and a second redistribution layer. The first seed layer may be arranged on a bottom region of the insulating layer structure adjacent to the side surface of the first semiconductor chip. The first plug may be formed on the first seed layer by the plating process. The second seed layer may be extended from the first plug to the first bonding pad. The first redistribution layer may be formed on the second seed layer to electrically connect the first plug and the first bonding pad with each other. The second plug may be formed on the first redistribution layer and in the insulating layer structure by the plating process. The third seed layer may be extended from the second plug to the second bonding pad. The second redistribution layer may be formed on the third seed layer by the plating process to electrically connect the second plug and the second bonding pad with each other.

In example embodiments, the insulating layer structure may include a first insulating layer pattern, a second insulating layer pattern, a third insulating layer pattern and a fourth insulating layer pattern. The first insulating layer pattern may be configured to cover the side surfaces and at least portions of an upper surface the first semiconductor chip. The first insulating layer pattern may have a first opening configured to expose the first bonding pad, and a first via hole configured to receive the first seed layer and the first plug. The second insulating layer pattern may be formed on the first insulating layer pattern. The second insulating layer pattern may have a first redistribution hole configured to receive the first redistribution layer. The third insulating layer pattern may be formed on the second insulating layer pattern to surround the second semiconductor chip. The third insulating layer pattern may have a second opening configured to expose the second bonding pad, and a second via hole configured to receive the second seed layer and the second plug. The fourth insulating layer pattern may be formed on the third insulating layer pattern. The fourth insulating layer pattern may have a second redistribution hole configured to receive the second redistribution layer.

In example embodiments, the multi-chip package may further include a connecting terminal connected with the plug structure. In example embodiments, the connecting terminal may be connected to an upper end of the plug structure. In example embodiments, the connecting terminal may be connected to a lower end of the plug structure.

In example embodiments, the multi-chip package may further include a package substrate configured to support the first semiconductor chip and the second semiconductor chip, and a molding member formed on an upper surface of the package substrate to cover the insulating layer structure.

In example embodiments, the multi-chip package may further include an external terminal mounted on a lower surface of the package substrate.

According to some example embodiments, there may be provided a method of manufacturing a multi-chip package. In the method of manufacturing the multi-chip package, a second semiconductor chip having a second bonding pad may be positioned over a first semiconductor chip having a first bonding pad. The method may include forming an insulating layer structure to cover side surfaces and upper surfaces of the first semiconductor chip and the second semiconductor chip. The first semiconductor chip and the second semiconductor chip may be surrounded with an insulating layer structure. A plug structure may be formed in the insulating layer structure by a plating process. The plug structure may be arranged spaced apart from side surfaces of the first semiconductor chip and the second semiconductor chip to electrically connect the first bonding pad and the second bonding pad with each other.

In example embodiments, forming the insulating structure and the plug structure may include forming a first seed layer on a supporting substrate, attaching the first semiconductor chip to the first seed layer, forming a first insulating layer pattern, which may have a first opening configured to expose the first bonding pad and a first via hole configured to expose the first seed layer, on the first seed layer to cover the first semiconductor chip, performing a first plating process on the first seed layer to form a first plug in the first via hole, extending a second seed layer from the first plug to the first bonding pad, performing a second plating process on the second seed layer to form a first redistribution layer configured to electrically connect the first plug with the first bonding pad, forming a second insulating layer pattern on the first insulating layer pattern to expose the first redistribution layer, attaching the second semiconductor chip to the second insulating layer pattern, forming a third insulating layer patter, which may have a second via hole configured to expose the first redistribution layer and a second opening configured to expose the second bonding pad, on the second insulating layer pattern to cover the second semiconductor chip, performing a third plating process on the first redistribution layer to form a second plug in the second via hole, extending a third seed layer from the second plug to the second bonding pad, performing a fourth plating process on the third seed layer to form a second redistribution layer configured to electrically connect the second plug with the second bonding pad, and forming a fourth insulating layer pattern on the third insulating layer pattern to expose the second redistribution layer.

In example embodiments, the method may further include forming a connecting terminal on the second redistribution layer. In example embodiments, the method may further include forming a connecting terminal on the first seed layer. In example embodiments, the method may further include forming a connecting terminal on the plug structure, and mounting the connecting terminal on a package substrate.

In example embodiments, the connecting terminal may be connected to a lower end of the plug structure. In example embodiments, the method may further include forming a molding member formed on an upper surface of the package substrate to cover the insulating layer structure, and mounting an external terminal on a lower surface of the package substrate.

According to example embodiments, the plug structure arranged along the side surfaces of the semiconductor chips may be formed by the simple plating process. Thus, a process for forming a micro bump between the plugs need not be performed. As a result, the multi-chip package avoids problems caused by the process for forming the micro bump.

BRIEF DESCRIPTION OF THE DRAWINGS

Example embodiments will be more clearly understood from the following detailed description taken in conjunction with the accompanying drawings.

FIG. 1 is a cross-sectional view illustrating a multi-chip package in accordance with example embodiments;

FIG. 2 is a perspective view illustrating the multi-chip package in FIG. 1;

FIGS. 3 to 33 are cross-sectional views illustrating a method of manufacturing the multi-chip package in FIG. 1;

FIG. 34 is a cross-sectional view illustrating a multi-chip package in accordance with example embodiments;

FIG. 35 is a cross-sectional view illustrating a multi-chip package in accordance with example embodiments; and FIG. 36 is a cross-sectional view illustrating a multi-chip package in accordance with example embodiments.

DETAILED DESCRIPTION OF THE EMBODIMENTS

Figure 1:
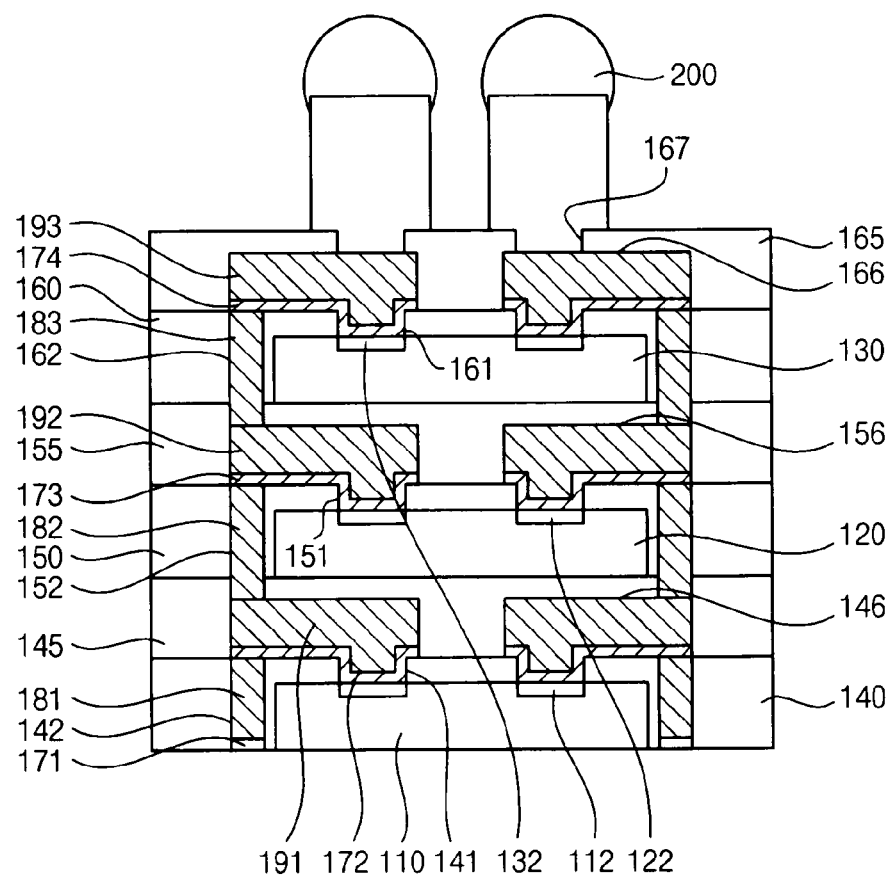
FIGS. 1 to 36 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not necessarily intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
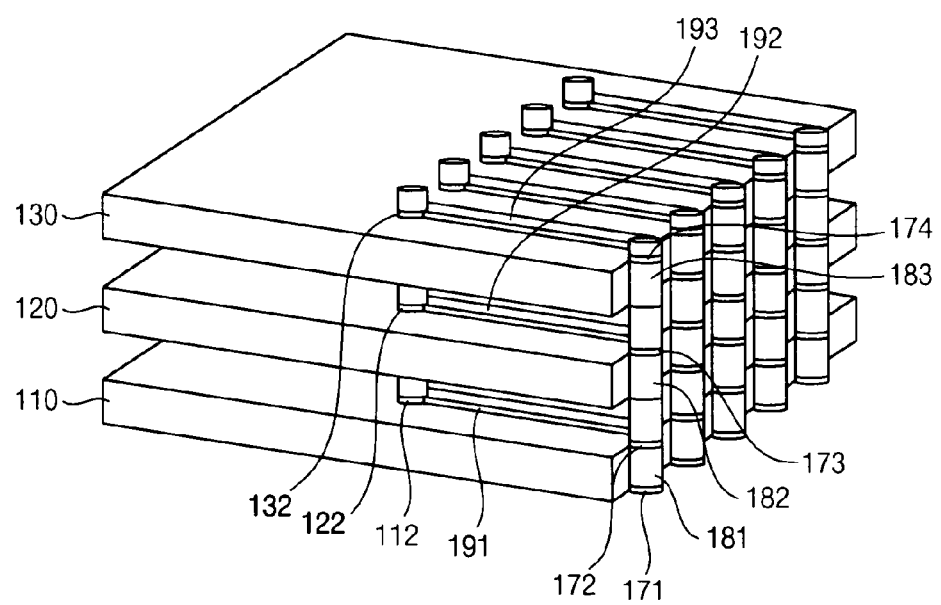

FIG. 1 is a cross-sectional view illustrating a multi-chip package in accordance with example embodiments, and FIG. 2 is a perspective view illustrating the multi-chip package in FIG. 1.

Referring to FIGS. 1 and 2, a multi-chip package 100 of this example embodiment may include a first semiconductor chip 110, a second semiconductor chip 120, a third semiconductor chip 130, an insulating layer structure (as further described below), a plug structure (as further described below), and a connecting terminal (e.g., 200).

In example embodiments, the first semiconductor chip 110, the second semiconductor chip 120 and the third semiconductor chip 130 may be sequentially stacked. Particularly, the second semiconductor chip 120 may be positioned over the first semiconductor chip 110. The third semiconductor chip 130 may be placed over the second semiconductor chip 120.

The first semiconductor chip 110 may have a first bonding pad (e.g., 112). In example embodiments, the first bonding pad 112 may be arranged on a central portion of an upper surface of the first semiconductor chip 110. Alternatively, the first bonding pad 112 may be arranged on an edge portion of the upper surface of the first semiconductor chip 110.

The second semiconductor chip 120 may have a second bonding pad (e.g., 122). In example embodiments, the second bonding pad 122 may be arranged on a central portion of an upper surface of the second semiconductor chip 120. Alternatively, the second bonding pad 122 may be arranged on an edge portion of the upper surface of the second semiconductor chip 120. In example embodiments, the second semiconductor chip 120 may have a size substantially the same as that of the first semiconductor chip 110. Alternatively, the second semiconductor chip 120 may have a size different from that of the first semiconductor chip 110.

The third semiconductor chip 130 may have a third bonding pad (e.g., 132). In example embodiments, the third bonding pad 132 may be arranged on a central portion of an upper surface of the third semiconductor chip 130. Alternatively, the third bonding pad 132 may be arranged on an edge portion of the upper surface of the third semiconductor chip 130. In example embodiments, the third semiconductor chip 130 may have a size substantially the same as that of the first semiconductor chip 110 and the second semiconductor chip 120. Alternatively, when the second semiconductor chip 120 has a size different from that of the first semiconductor chip 110, the third semiconductor chip 130 may have a size substantially the same as that of any one of the first semiconductor chip 110 and the second semiconductor chip 120. Further, the third semiconductor chip 130 may have a size different from the sizes of the first semiconductor chip 110 and the second semiconductor chip 120.

The insulating layer structure may be configured to surround the stacked first, second and the third semiconductor chips 110, 120 and 130, respectively. In example embodiments, the insulating layer structure may surround side surfaces of the first, second and third semiconductor chips 110, 120 and 130, respectively, and the upper surface of the third semiconductor chip 130.

The insulating layer structure may include a first insulating layer pattern (e.g., 140), a second insulating layer pattern (e.g., 145), a third insulating layer pattern (e.g., 150), a fourth insulating layer pattern (e.g., 155), a fifth insulating layer pattern (e.g., 160) and a sixth insulating layer pattern (e.g., 165).

The first insulating layer pattern 140 may be configured to cover the side surface and at least portions of the upper surface of the first semiconductor chip 110. In example embodiments, the first insulating layer pattern 140 may have a first opening (e.g., 141) configured to expose the first bonding pad 112, and a first via hole (e.g., 142) arranged adjacent to the side surface of the first semiconductor chip 110. Particularly, the first via hole 142 may be spaced apart from the side surface of the first semiconductor chip 110. The first via hole 142 may be vertically extended substantially parallel to the side surface of the first semiconductor chip 110. The first via hole 142 may have a lower end that is level with or otherwise exposed through a lower surface of the first insulating layer pattern 140, and an upper end that is level with or otherwise exposed through an upper surface of the first insulating layer pattern 140.

The second insulating layer pattern 145 may be formed on the first insulating layer pattern 140. In example embodiments, the second insulating layer pattern 145 may have a first redistribution hole (e.g., 146) in fluidic communication with the first via hole 142. The first redistribution hole 146 may be horizontally extended from the upper end of the first via hole 142 to an upper surface of the first bonding pad 112.

The third insulating layer pattern 150 may be formed on the second insulating layer pattern 145 to cover the side surface and at least portions of the upper surface of the second semiconductor chip 120. In example embodiments, the third insulating layer pattern 150 may have a second opening (e.g., 151) configured to expose the second bonding pad 122, and a second via hole (e.g., 152) arranged adjacent to the side surface of the second semiconductor chip 120. Particularly, the second via hole 152 may be spaced apart from the side surface of the second semiconductor chip 120. The second via hole 152 may be vertically extended substantially parallel to the side surface of the second semiconductor chip 120. The second via hole 152 may have a lower end that is level with or otherwise exposed through a lower surface of the third insulating layer pattern 150 and connected with the first redistribution hole 146, and an upper end that is level with or otherwise exposed through an upper surface of the third insulating layer pattern 150.

The fourth insulating layer pattern 155 may be formed on the third insulating layer pattern 150. In example embodiments, the fourth insulating layer pattern 155 may have a second redistribution hole (e.g., 156) in fluidic communication with the second via hole 152. The second redistribution hole 156 may be horizontally extended from the upper end of the second via hole 152 to an upper surface of the second bonding pad 122.

The fifth insulating layer pattern 160 may be formed on the fourth insulating layer pattern 155 to cover the side surface and at least portions of the upper surface of the third semiconductor chip 130. In example embodiments, the fifth insulating layer pattern 160 may have a third opening (e.g., 161) configured to expose the third bonding pad 132, and a third via hole (e.g., 162) arranged adjacent to the side surface of the third semiconductor chip 130. Particularly, the third via hole 162 may be spaced apart from the side surface of the third semiconductor chip 130. The third via hole 162 may be vertically extended substantially parallel to the side surface of the third semiconductor chip 130. The third via hole 162 may have a lower end that is level with or otherwise exposed through a lower surface of the fifth insulating layer pattern 160 and connected with the second redistribution hole 156, and an upper end that is level with or otherwise exposed through an upper surface of the fifth insulating layer pattern 160.

The sixth insulating layer pattern 165 may be formed on the fifth insulating layer pattern 160. In example embodiments, the sixth insulating layer pattern 165 may have a third redistribution hole (e.g., 166) in fluidic communication with the third via hole 162. The third redistribution hole 166 may be horizontally extended from the upper end of the third via hole 162 to an upper surface of the third bonding pad 132.

Therefore, the first via hole 142, the second via hole 152 and the third via hole 162 may be formed vertically through portions of at least the first insulating layer pattern 140, the third insulating layer pattern 150 and the fifth insulating layer pattern 160, respectively. Moreover, the first via hole 142, the second via hole 152 and the third via hole 162 may be spaced apart from the side surfaces of the first semiconductor chip 110, the second semiconductor chip 120 and the third semiconductor chip 130, respectively.

In example embodiments, the first semiconductor chip 110, the second semiconductor chip 120 and the third semiconductor chip 130 may have substantially the same size. When the first semiconductor chip 110, the second semiconductor chip 120 and the third semiconductor chip 130 have substantially the same size, the first via hole 142, the second via hole 152 and the third via hole 162 may have substantially the same co-axis and diameter. In this case, the first redistribution hole 146, the second redistribution hole 156 and the third redistribution hole 166 may have substantially the same length.

Alternatively, the first semiconductor chip 110, the second semiconductor chip 120 and the third semiconductor chip 130 may have different sizes. When the first semiconductor chip 110, the second semiconductor chip 120 and the third semiconductor chip 130 have different sizes, the first via hole 142, the second via hole 152 and the third via hole 162 may have the same diameter, but need not have the same co-axis. In this case, the first redistribution hole 146, the second redistribution hole 156 and the third redistribution hole 166 may have different lengths.

The plug structure may be formed in the insulating layer structure to electrically connect the first semiconductor chip 110, the second semiconductor chip 120 and the third semiconductor chip with each other. In example embodiments, the plug structure may include a first seed layer (e.g., 171), a second seed layer (e.g., 172), a third seed layer (e.g., 173), a fourth seed layer (e.g., 174), a first plug (e.g., 181), a second plug (e.g., 182), a third plug (e.g., 183), a first redistribution layer (e.g., 191), a second redistribution layer (e.g., 192) and a third redistribution layer (e.g., 193).

The first seed layer 171 may be arranged on a bottom region of the first via hole 142. In example embodiments, the first seed layer 171 may include a titanium layer.

The first plug 181 may be formed on the first seed layer 171 to fill the first via hole 142. In example embodiments, the first plug 181 may be formed by a plating process (e.g., an electroplating process) on the first seed layer 171. The first plug 181 may include a copper layer.

In example embodiments, the multi-chip package 100 in FIG. 1 may include the first seed layer 171. However, when the multi-chip package 100 is manufactured, the first seed layer 171 may be formed on a supporting substrate (not shown) to which the first semiconductor chip 110 may be attached. The first seed layer 171 may be exposed through the first via hole 142. The supporting substrate may be detached from the first semiconductor chip 110. When the supporting substrate is detached from the first semiconductor chip 110, the first seed layer 171 may also be detached together with the supporting substrate. Thus, the multi-chip package 100 of this example embodiment need not include the first seed layer 171.

The second seed layer 172 may be formed on the first plug 181, the first bonding pad 112 and a portion of the first insulating layer pattern 140 between the first plug 181 and the first bonding pad 112. Particularly, the second seed layer 172 may be extended from the first plug 181 to the first bonding pad 112 along the upper surface of the first insulating layer pattern 140. In example embodiments, the second seed layer 172 may include a material substantially the same as that of the first seed layer 171.

The first redistribution layer 191 may be formed on the second seed layer 172 to fill the first redistribution hole 146. In example embodiments, the first redistribution layer 191 may be formed by a plating process (e.g., an electroplating process) on the second seed layer 172. The first redistribution layer 191 may include a material substantially the same as that of the first plug 181.

The second plug 182 may be formed on the first redistribution layer 191 to fill the second via hole 152. In example embodiments, the second plug 182 may be formed by a plating process (e.g., an electroplating process) on the first redistribution layer 191. The second plug 182 may include a copper layer.

The third seed layer 173 may be formed on the second plug 182, the second bonding pad 122 and a portion of the third insulating layer pattern 150 between the second plug 182 and the second bonding pad 122. Particularly, the third seed layer 173 may be extended from the second plug 182 to the second bonding pad 122 along the upper surface of the third insulating layer pattern 150. In example embodiments, the third seed layer 173 may include a material substantially the same as that of the first seed layer 171.

The second redistribution layer 192 may be formed on the third seed layer 173 to fill the second redistribution hole 156.

In example embodiments, the second redistribution layer 192 may be formed by a plating process (e.g., an electroplating process) on the third seed layer 173. The second redistribution layer 192 may include a material substantially the same as that of the first plug 181.

The third plug 183 may be formed on the second redistribution layer 192 to fill the third via hole 162. In example embodiments, the third plug 183 may be formed by a plating process (e.g., an electroplating process) on the second redistribution layer 192. The third plug 183 may include a copper layer.

The fourth seed layer 174 may be formed on the third plug 183, the third bonding pad 132 and a portion of the fifth insulating layer pattern 160 between the third plug 183 and the third bonding pad 132. Particularly, the fourth seed layer 174 may be extended from the third plug 183 to the third bonding pad 132 along the upper surface of the fifth insulating layer pattern 160. In example embodiments, the fourth seed layer 174 may include a material substantially the same as that of the first seed layer 171.

The third redistribution layer 193 may be formed on the fourth seed layer 174 to fill the third redistribution hole 166. In example embodiments, the third redistribution layer 193 may be formed by a plating process (e.g., an electroplating process) on the fourth seed layer 174. The third redistribution layer 193 may include a material substantially the same as that of the first plug 181.

In example embodiments, the first via hole 142, the second via hole 152 and the third via hole 162 may be vertically formed along the side surfaces of the first semiconductor chip 110, the second semiconductor chip 120 and the third semiconductor chip 130, respectively. Thus, the first plug 181, the second plug 182 and the third plug 183 may also be vertically arranged along the side surfaces of the first semiconductor chip 110, the second semiconductor chip 120 and the third semiconductor chip 130, respectively. That is, the first plug 181, the second plug 182 and third plug 183 may be vertically positioned to the outside, not the inside, of the first semiconductor chip 110, the second semiconductor chip 120 and the third semiconductor chip 130.

The connecting terminal 200 may be connected to the third redistribution layer 193. In example embodiments, the connecting terminal 200 may be formed by an electroplating process on the third redistribution layer 193 exposed through an opening (e.g., 167) of the sixth insulating layer pattern 165. Alternatively, the connecting terminal 200 may be formed by mounting a conductive bump on the third redistribution layer 193.

FIGS. 3 to 33 are cross-sectional views illustrating a method of manufacturing the multi-chip package in FIG. 1.

Figure 3:
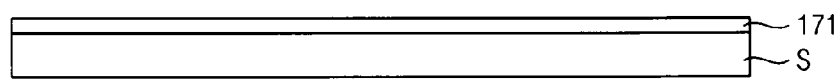

Referring to FIG. 3, the first seed layer 171 may be formed on an upper surface of the supporting substrate S. In example embodiments, the supporting substrate S may include a dummy wafer.

Figure 4:
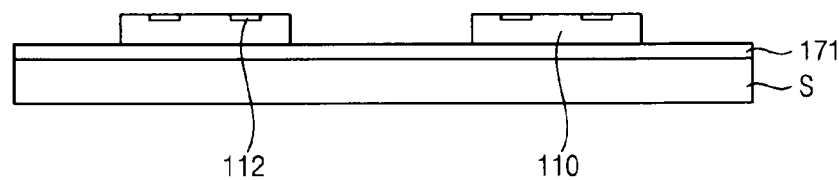

Referring to FIG. 4, the first semiconductor chip (e.g., 110) may be attached to the upper surface of the first seed layer 171. The first semiconductor chip 110 may have a first bonding pad (e.g., 112) disposed thereon.

Figure 5:
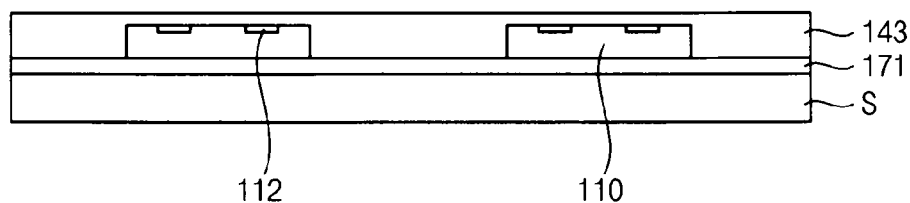

Referring to FIG. 5, a first insulating layer 143 may be formed on the first seed layer 171 to cover the first semiconductor chip 110.

Figure 6:
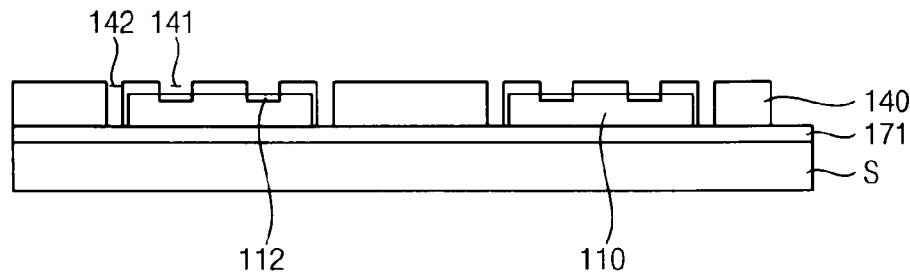

Referring to FIG. 6, the first insulating layer 143 may be patterned to form the first insulating layer pattern 140. In example embodiments, the first insulating layer pattern 140 may have the first opening 141 configured to expose the first bonding pad 112 of the first semiconductor chip 110, and the first via hole 142 configured to expose the first seed layer 171.

The first via hole 142 may be spaced apart from the side surface of the first semiconductor chip 110. Further, the first via hole 142 may be vertically extended substantially parallel to the side surface of the first semiconductor chip 110. The first insulating layer pattern 140 may be formed by etching the first insulating layer 143. Further, a portion of the first seed layer 171 on an edge portion of the supporting substrate S may be exposed by the patterning process. The exposed portion of the first seed layer 171 may be used for an electrode of a following electroplating process. The first insulating layer pattern 140 may then be annealed.

Figure 7:
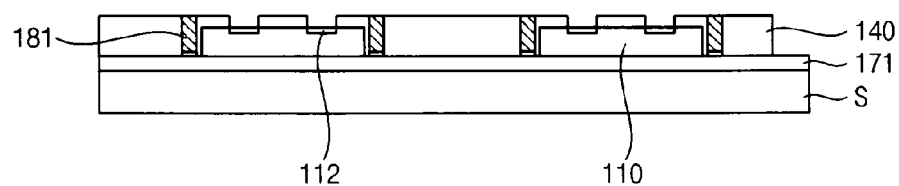

Referring to FIG. 7, a first electroplating process may be performed on the first seed layer 171 exposed through the first via hole 142 to form the first plug 181 in the first via hole 142.

Figure 8:
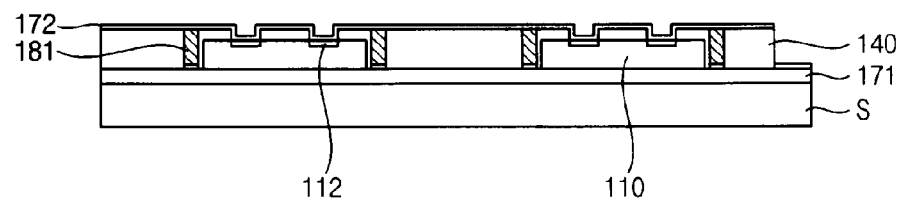

Referring to FIG. 8, the second seed layer 172 may be formed on the upper surface of the first insulating layer pattern 140 to electrically connect the first plug 181 with the first bonding pad 112 via the second seed layer 172. A portion of the second seed layer 172 may also be formed on the exposed portion of the first seed layer 171 on the edge portion of the supporting substrate S. The portion of the second seed layer 172 on the portion of the first seed layer 171 may be used as an electrode for a following electroplating process.

Figure 9:
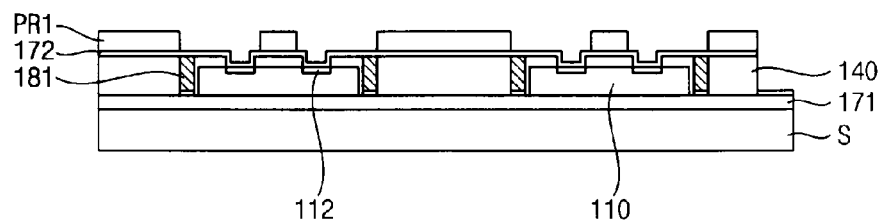

Referring to FIG. 9, a first photoresist pattern PR1 may be formed on the upper surface of the second seed layer 172. In example embodiments, the first photoresist pattern PR1 may have an opening configured to expose a portion of the second seed layer 172 between the first plug 181 and the first bonding pad 112.

Figure 10:
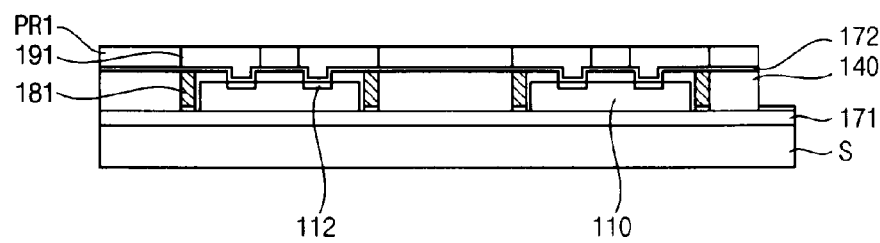

Referring to FIG. 10, a second plating process may be performed on the second seed layer 172 exposed through the opening of the first photoresist pattern PR1 to form the first redistribution layer 191 extended from the first plug 181 to the first bonding pad 112.

Alternatively, the first semiconductor chip 110 may have a thickness that is thinner than a predefined dimension. When the first semiconductor chip 110 has a thickness that is thinner than the predefined dimension, the first plug 181 and the first redistribution layer 191 may be formed simultaneously with each other without use of the second seed layer 172. In this case, the first plug 181 and the first redistribution layer 191 may be simultaneously formed by a plating process on the first seed layer 171. Thus, the processes for forming the first photoresist pattern PR1 and the second seed layer 172 may be omitted.

Figure 11:
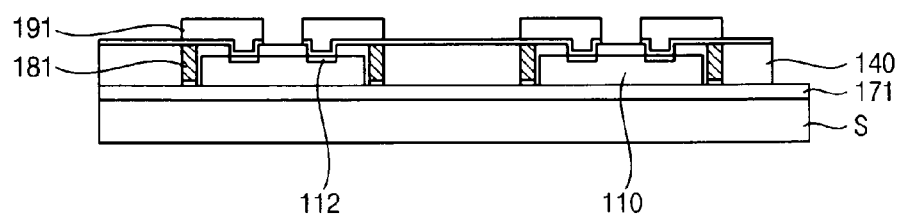

Referring to FIG. 11, the first photoresist pattern PR1 may then be removed. In example embodiments, the first photoresist pattern PR1 may be removed by a stripping process and/or an ashing process.

Figure 12:
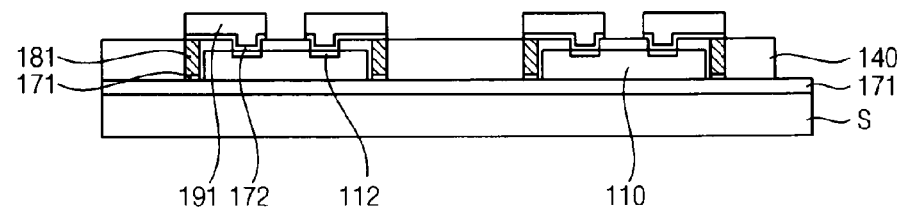

Referring to FIG. 12, a remaining portion of the second seed layer 172 may then be removed. In example embodiments, the remaining portion of the second seed layer 172 may be removed by an etching process.

Figure 13:
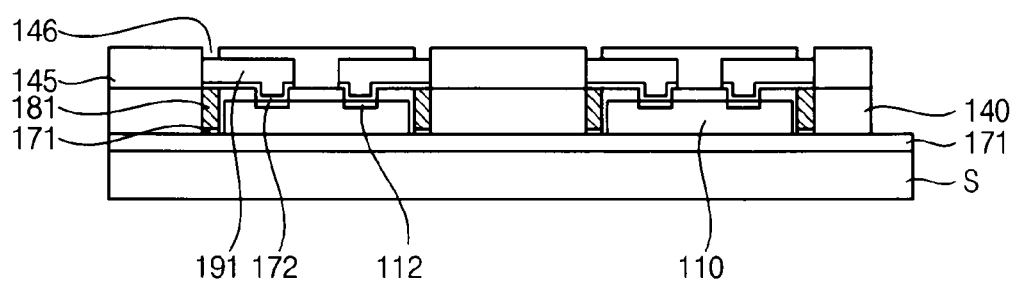

Referring to FIG. 13, the second insulating layer pattern 145 may be formed on the upper surface of the first insulating layer pattern 140 to cover the first redistribution layer 191. The second insulating layer pattern 145 may have the first redistribution hole 146 configured therein to receive the first redistribution layer 191. The first redistribution layer 191 may be partially exposed through the first redistribution hole 146.

Figure 14:
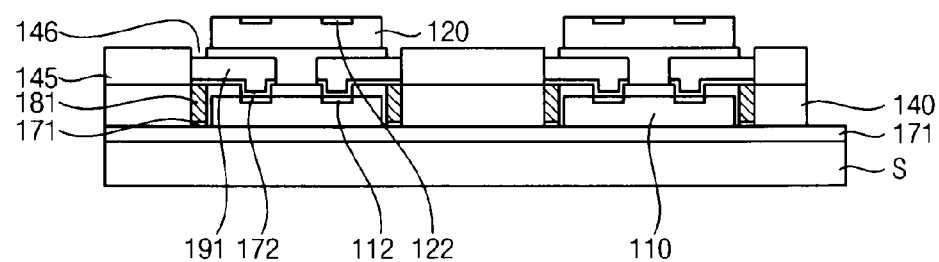

Referring to FIG. 14, the second semiconductor chip 120 may be attached to the upper surface of the second insulating layer pattern 145.

Figure 15:
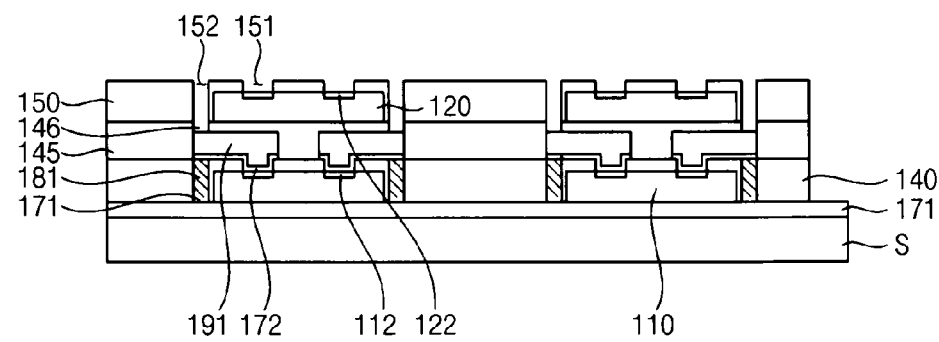

Referring to FIG. 15, the third insulating layer pattern 150 may be formed on the upper surface of the second insulating layer pattern 145 to cover the second semiconductor chips 120. In example embodiments, the third insulating layer pattern 150 may have the second opening 151 configured therein to expose the second bonding pad 122 of the second semiconductor chip 120. In addition, the third insulating layer pattern 150 may have the second via hole 152 configured therein to expose the first redistribution layer 191. The second via hole 152 may be spaced apart from the side surface of the second semiconductor chip 120. Further, the second via hole 152 may be vertically extended substantially parallel to the side surface of the second semiconductor chip 120.

Figure 16:
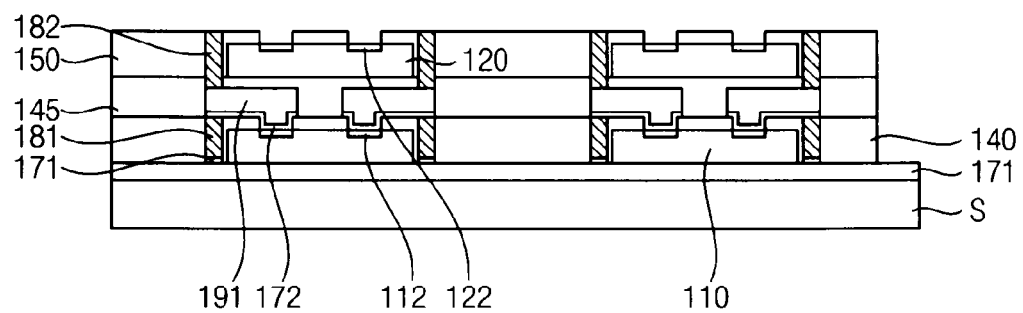

Referring to FIG. 16, a third electroplating process may be performed on the first redistribution layer 191 exposed through the second via hole 152 to form the second plug 182 in the second via hole 152.

Figure 17:
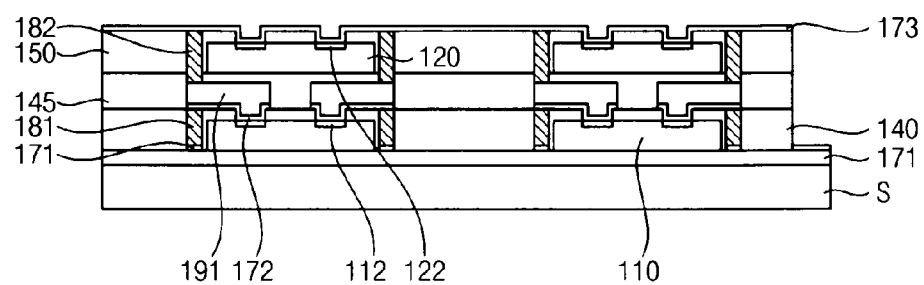

Referring to FIG. 17, the third seed layer 173 may be formed on the upper surface of the third insulating layer pattern 150 to electrically connect the second plug 182 with the second bonding pad 122 via the third seed layer 173. A portion of the third seed layer 173 may also be formed on the exposed portion of the first seed layer 171 on the edge portion of the supporting substrate S.

Figure 18:
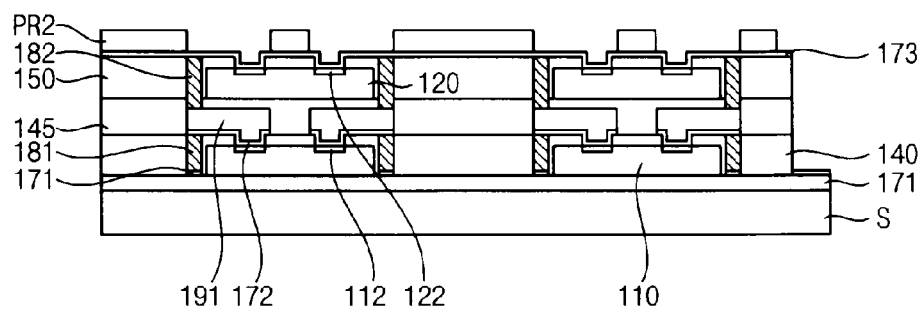

Referring to FIG. 18, a second photoresist pattern PR2 may be formed on the upper surface of the third seed layer 173. In example embodiments, the second photoresist pattern PR2 may have an opening configured to expose a portion of the third seed layer 173 between the second plug 182 and the second bonding pad 122.

Figure 19:
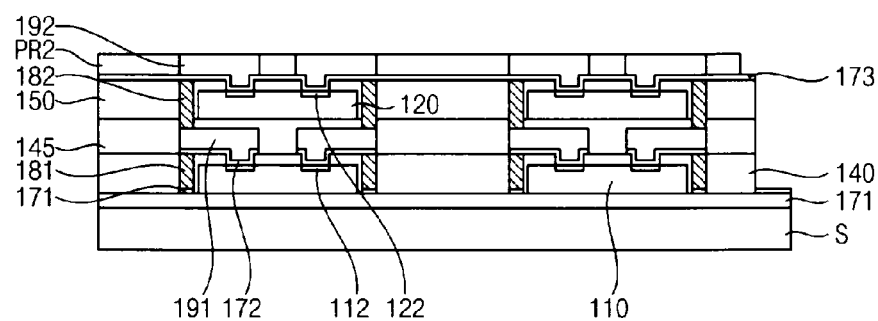

Referring to FIG. 19, a fourth plating process may be performed on the third seed layer 173 exposed through the opening of the second photoresist pattern PR2 to form the second redistribution layer 192 extended from the second plug 182 to the second bonding pad 122.

Alternatively, the second semiconductor chip 120 may have a thickness that is thinner than a predefined dimension. When the second semiconductor chip 120 has a thickness that is thinner than the predefined dimension, the second plug 182 and the second redistribution layer 192 may be formed simultaneously with each other without use of the third seed layer 173. In this case, the second plug 182 and the second redistribution layer 192 may be simultaneously formed by a plating process on the second seed layer 172. Thus, the processes for forming the second photoresist pattern PR2 and the third seed layer 173 may be omitted.

Figure 20:
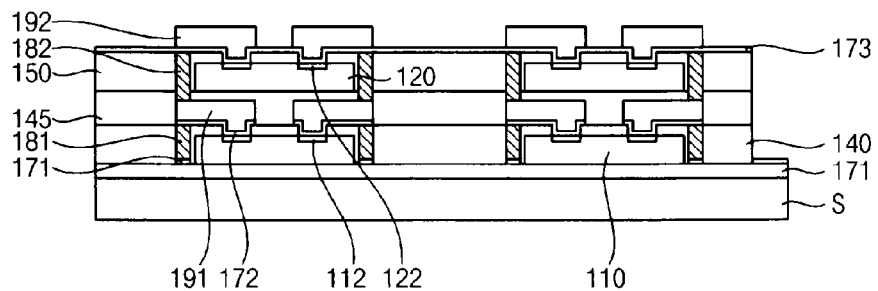

Referring to FIG. 20, the second photoresist pattern PR2 may then be removed. In example embodiments, the second photoresist pattern PR2 may be removed by a stripping process and/or an ashing process.

Figure 21:
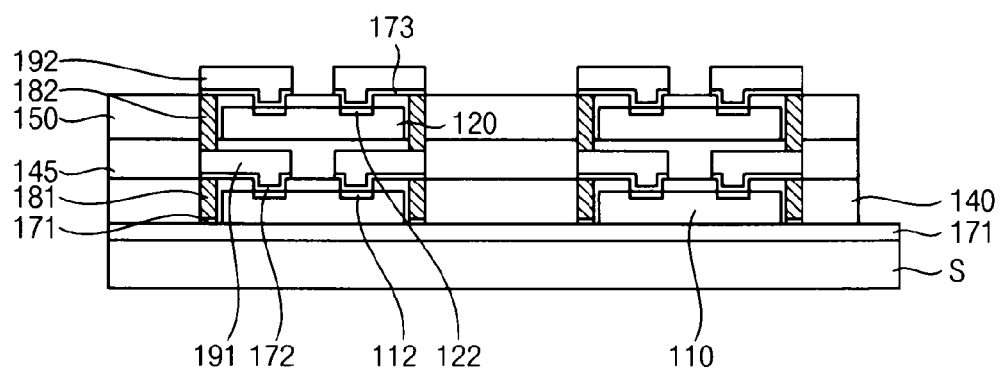

Referring to FIG. 21, a remaining portion of the third seed layer 173 may then be removed. In example embodiments, the remaining exposed portion of the third seed layer 173 may be removed by an etching process.

Figure 22:
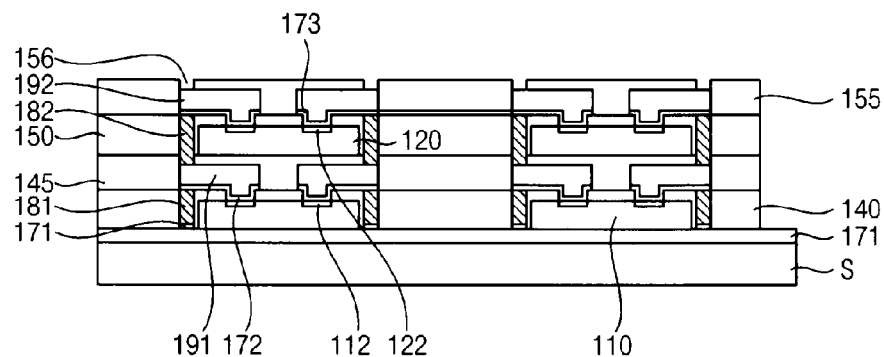

Referring to FIG. 22, the fourth insulating layer pattern 155 may be formed on the upper surface of the third insulating layer pattern 150 to cover the second redistribution layer 192. The fourth insulating layer pattern 155 may have the second redistribution hole 156 configured therein to receive the second redistribution layer 192.

Figure 23:
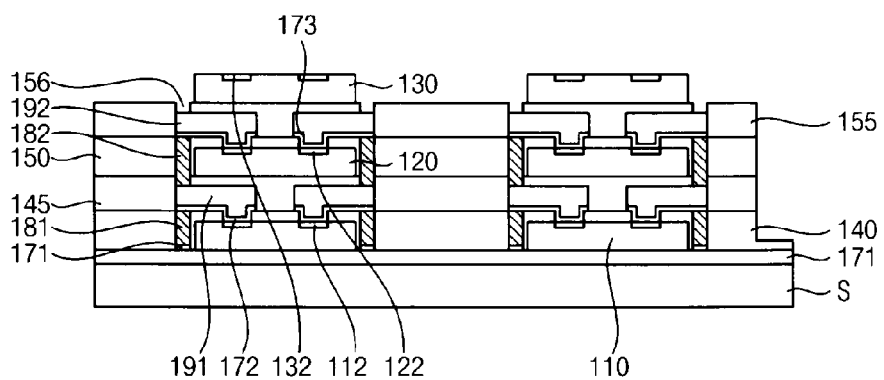

Referring to FIG. 23, the third semiconductor chip 130 may be attached to the upper surface of the fourth insulating layer pattern 155.

Figure 24:
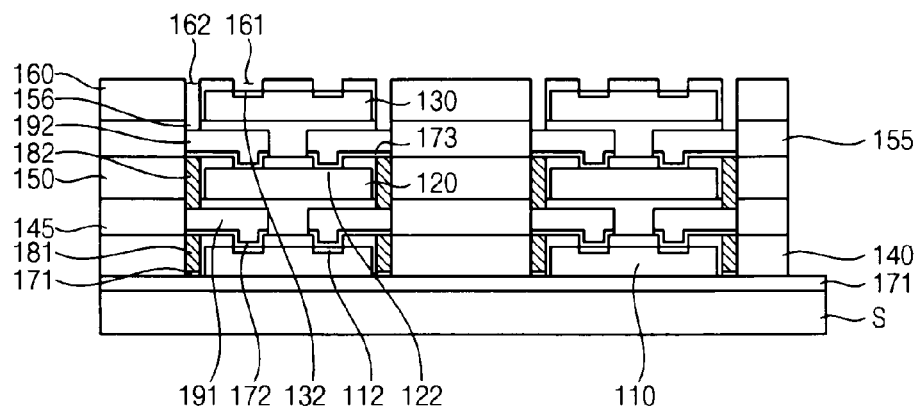

Referring to FIG. 24, the fifth insulating layer pattern 160 may be formed on the upper surface of the fourth insulating layer pattern 155 to cover the third semiconductor chip 130. In example embodiments, the fifth insulating layer pattern 160 may have the third opening 161 configured therein to expose the third bonding pad 132 of the third semiconductor chip 130. In addition, the fifth insulating layer pattern 160 may have the third via hole 162 configured therein to expose the second redistribution layer 192. The third via hole 162 may be spaced apart from the side surface of the third semiconductor chip 130. Further, the third via hole 162 may be vertically extended substantially parallel to the side surface of the third semiconductor chip 130.

Figure 25:
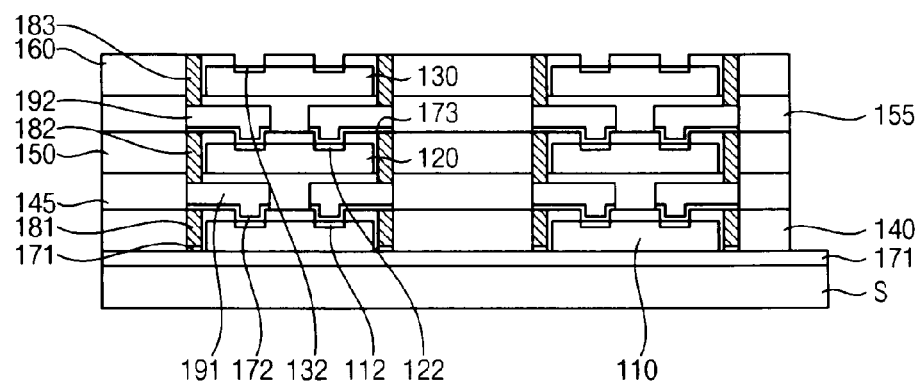

Referring to FIG. 25, a fifth electroplating process may be performed on the second redistribution layer 192 exposed through the third via hole 162 to form the third plug 183 in the third via hole 162.

Figure 26:
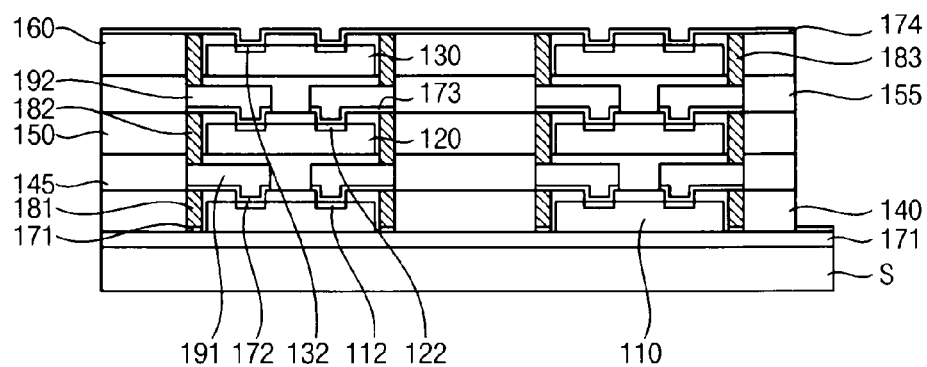

Referring to FIG. 26, the fourth seed layer 174 may be formed on the upper surface of the fifth insulating layer pattern 160 to electrically connect the third plug 183 with the third bonding pad 132 via the fourth seed layer 174. A portion of the fourth seed layer 174 may also be formed on the portion of the first seed layer 171 on the edge portion of the supporting substrate S.

Figure 27:
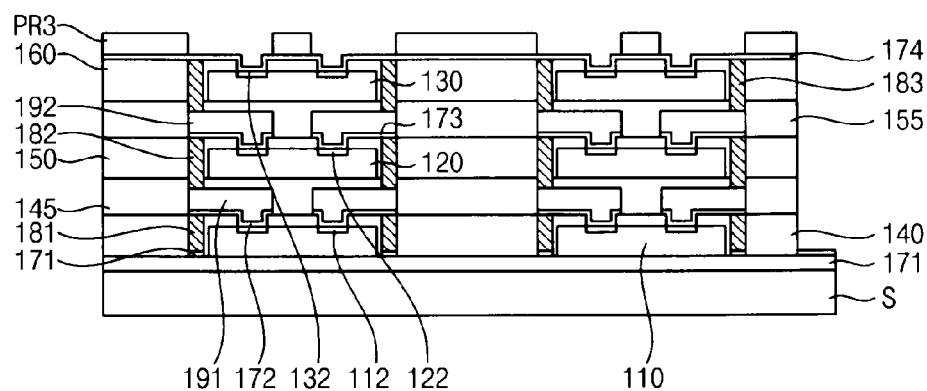

Referring to FIG. 27, a third photoresist pattern PR3 may be formed on the upper surface of the fourth seed layer 174. In example embodiments, the third photoresist pattern PR3 may have an opening configured therein to expose a portion of the fourth seed layer 174 between the third plug 183 and the third bonding pad 132.

Figure 28:
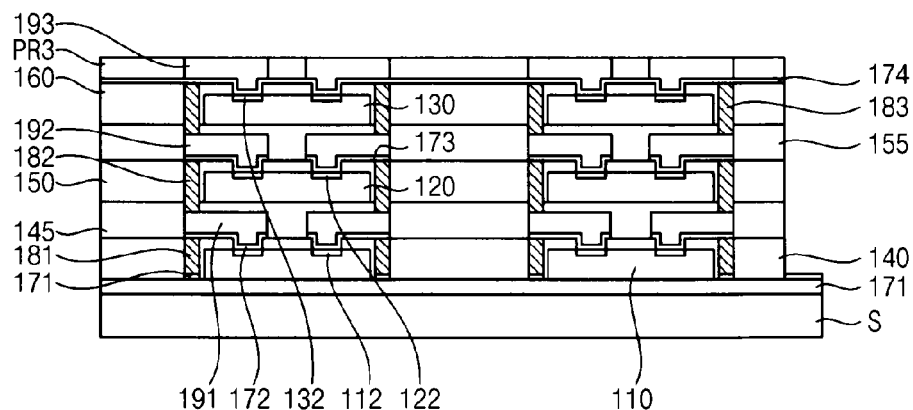

Referring to FIG. 28, a sixth plating process may be performed on the fourth seed layer 174 exposed through the opening of the third photoresist pattern PR3 to form the third redistribution layer 193 extended from the third plug 183 to the third bonding pad 132.

Alternatively, the third semiconductor chip 130 may have a thickness that is thinner than a predefined dimension. When the third semiconductor chip 130 has a thickness that is thinner than the predefined dimension, the third plug 183 and the third redistribution layer 193 may be formed simultaneously with each other without use of the fourth seed layer 174. In this case, the third plug 183 and the third redistribution layer 193 may be simultaneously formed by a plating process on the third seed layer 173. Thus, the processes for forming the third photoresist pattern PR3 and the fourth seed layer 174 may be omitted.

Figure 29:
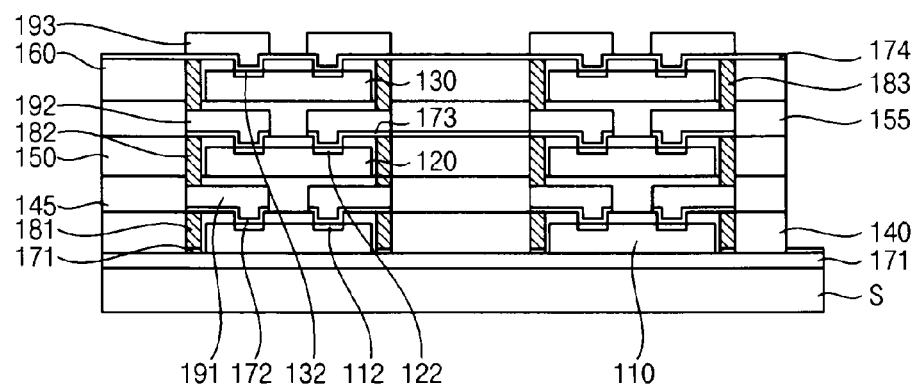

Referring to FIG. 29, the third photoresist pattern PR3 may then be removed. In example embodiments, the third photoresist pattern PR3 may be removed by a stripping process and/or an ashing process.

Figure 30:
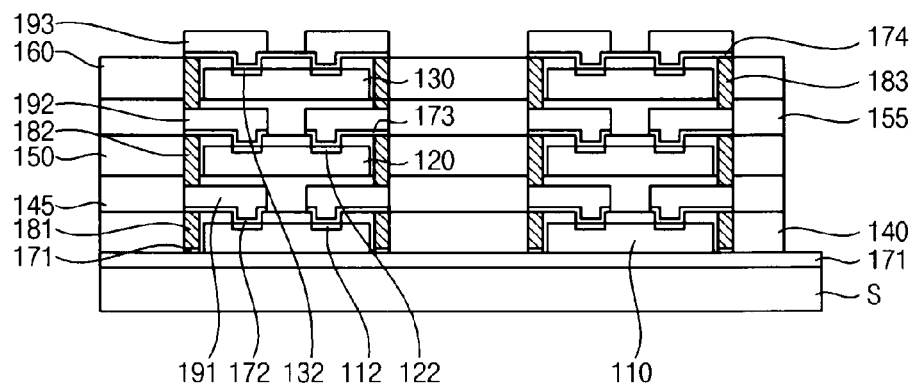

Referring to FIG. 30, a remaining exposed portion of the fourth seed layer 174 may then be removed. In example embodiments, the remaining portion of the fourth seed layer 174 may be removed by an etching process.

Figure 31:
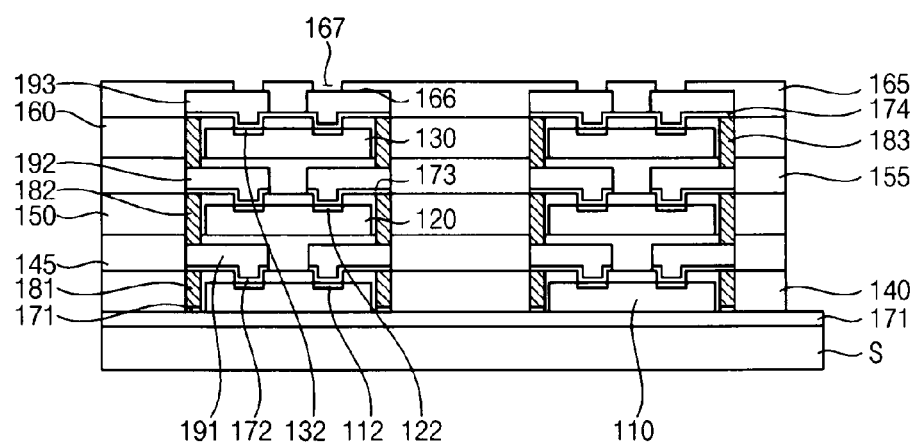

Referring to FIG. 31, the sixth insulating layer pattern 165 may be formed on the upper surface of the fifth insulating layer pattern 160 to cover the third redistribution layer 193. The sixth insulating layer pattern 165 may have the third redistribution hole 166 configured therein to receive the third redistribution layer 193. In example embodiments, the sixth insulating layer pattern 165 may have an opening 167 configured therein to expose the upper surface of the third redistribution layer 193.

Figure 32:
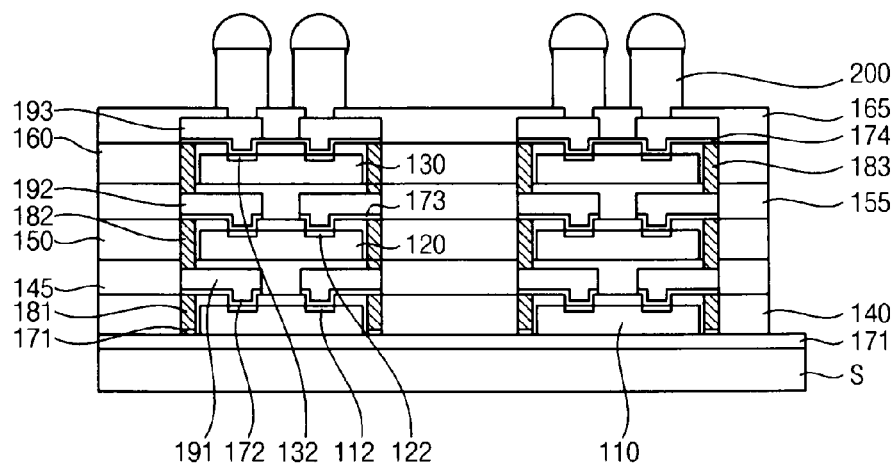

Referring to FIG. 32, the connecting terminal 200 may be connected with the third redistribution layer 193. In example embodiments, the connecting terminal 200 may be formed by an electroplating process on the third redistribution layer 193 exposed through the opening 167. Alternatively, the connecting terminal 200 may be formed by mounting the conductive bump on the third redistribution layer 193.

Figure 33:
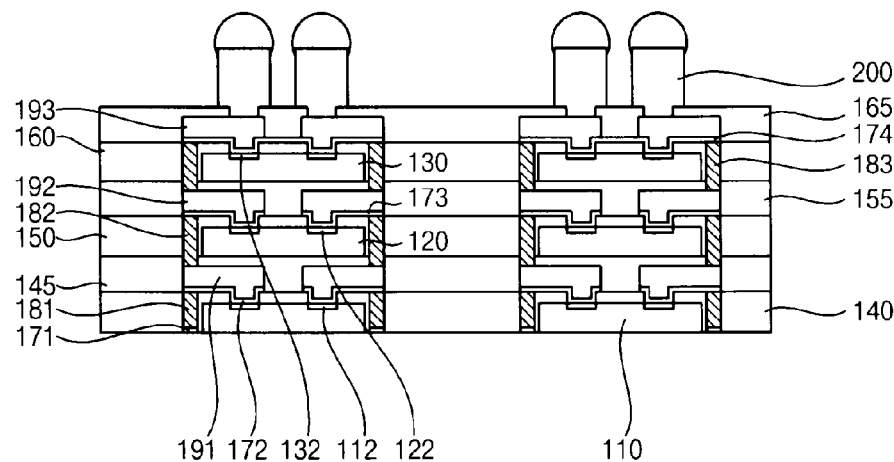

Referring to FIG. 33, the supporting substrate S may be removed from the first semiconductor chips 110 and the first insulating layer pattern 140. In example embodiments, the supporting substrate S may be removed by a grinding process.

Portions of the insulating layer structure between the first, second and the third semiconductor chips 110, 120 and 130, respectively, may be cut to form the complete the multi-chip package 100 in FIG. 1.

According to this example embodiment, the plug structure may be formed by the electroplating process on the seed layer. Thus, a process for electrically connecting the plugs with each other using additional micro bumps is not required. As a result, the multi-chip package does not have the problems associated with the process for forming the micro bump.

Figure 34:
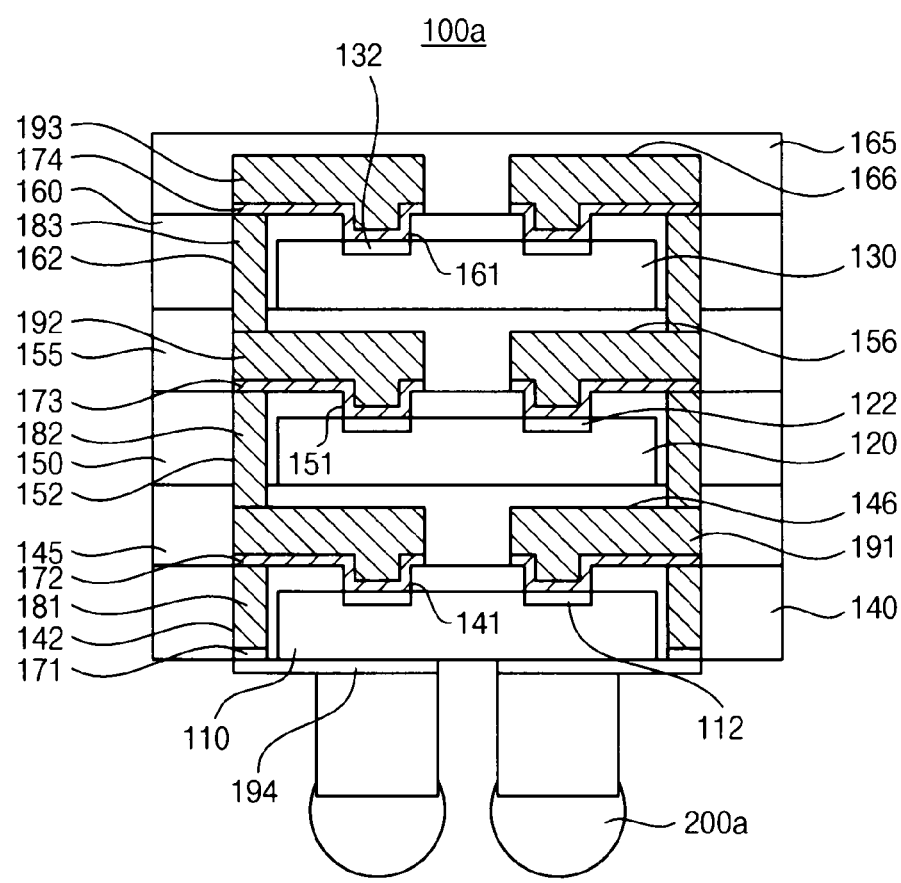

FIG. 34 is a cross-sectional view illustrating a multi-chip package in accordance with example embodiments.

A multi-chip package 100a of this example embodiment may include elements substantially the same as those of the multi-chip package 100 in FIG. 1 except for a position of the connecting terminal. Thus, the same reference numerals refer to the same elements and any further illustrations with respect to the same elements are omitted herein for the sake of brevity.

Referring to FIG. 34, the connecting terminal 200a of this example embodiment may be connected to the lower surface of the first seed layer 171. In example embodiments, the connecting terminal 200a may be connected to the first seed layer 171 via a fourth redistribution layer (e.g., 194) formed on the lower surface of the first semiconductor chip 110. Alternatively, the first seed layer 171 may be removed together with the supporting substrate S. When the first seed layer 171 is removed together with the supporting substrate S, the connecting terminal 200a may be connected to the lower end of the first plug 181.

In example embodiments, because the connecting terminal 200a may be connected to the first seed layer 171 or the first plug 181, the sixth insulating layer pattern 165 need not have the opening 167 configured to expose the upper surface of the third redistribution layer 193. Thus, the third redistribution layer 193 may be fully covered with the sixth insulating layer pattern 165.

A method of manufacturing the multi-chip package 100a may include processes substantially the same as those illustrated with reference to FIGS. 3 to 31 except for a process for connecting the connecting terminal 200a with the first seed layer 171 or the first plug 181. Thus, any further illustrations with respect to the method of manufacturing the multi-chip package 100a are omitted herein for the sake of brevity.

Figure 35:
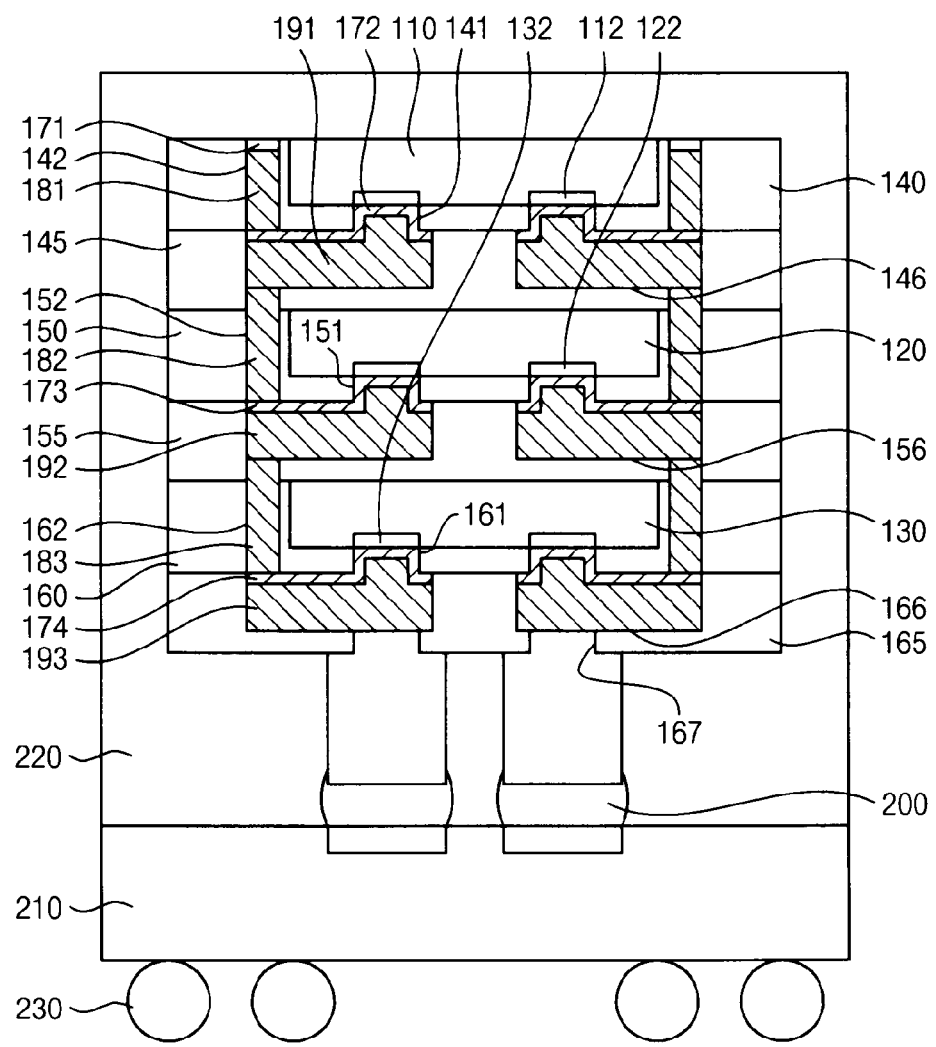

FIG. 35 is a cross-sectional view illustrating a multi-chip package in accordance with example embodiments.

A multi-chip package 100b of this example embodiment may include elements substantially the same as those of the multi-chip package 100 in FIG. 1 except for further including a package substrate 210, a molding member 220 and an external terminal 230. Thus, the same reference numerals refer to the same elements and any further illustrations with respect to the same elements are omitted herein for the sake of brevity.

Referring to FIG. 35, the multi-chip package 100 in FIG. 1 may be positioned over the package substrate 210. Particularly, the multi-chip package 100 in FIG. 1 may be downwardly reversed, so that the connecting terminal 200 connected to the third redistribution layer 193 may be oriented toward the package substrate 210. That is, the third semiconductor chip 130, the second semiconductor chip 120 and the first semiconductor chip 110 may be sequentially stacked. Thus, the multi-chip package 100b may correspond to a face-down type package where active surfaces of the first, second and the third semiconductor chips 110, 120 and 130, respectively, on which the first, second third bonding pads 112, 122 and 132 may be arranged may be oriented downwardly. The connecting terminal 200 may be mounted on an upper surface of the package substrate 210. The connecting terminal 200 may electrically make contact with a circuit pattern (not shown) of the package substrate 210.

The molding member 220 may be formed on the upper surface of the package substrate 210 to cover the insulating layer structure. In example embodiments, the molding member 220 may protect the first semiconductor chip 110, the second semiconductor chip 120 and the third semiconductor chip 130 from external environments. The molding member 220 may include an epoxy molding compound (EMC).

The external terminal 230 may be mounted on a lower surface of the package substrate 210. The external terminal 230 may electrically make contact with the circuit pattern of the package substrate 210. In example embodiments, the external terminal 230 may include a solder ball.

A method of manufacturing the multi-chip package 100b may include processes substantially the same as those illustrated with reference to FIGS. 3 to 33 except for further including a process for mounting the connecting terminal 200 on the package substrate 210, a process for forming the molding member 220 on the upper surface of the package substrate 210, and a process for mounting the external terminal on the lower surface of the package substrate 210. Thus, any further illustrations with respect to the method of manufacturing the multi-chip package 100b are omitted herein for the sake of brevity.

Figure 36:
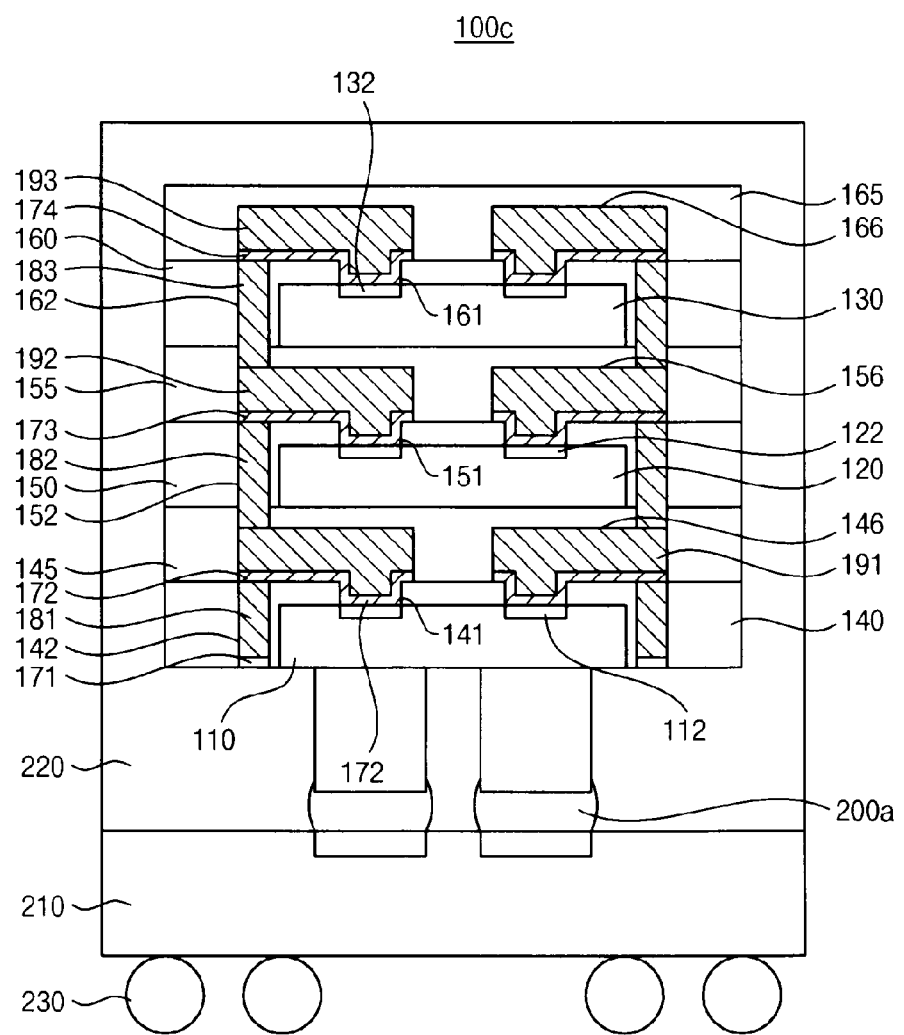

FIG. 36 is a cross-sectional view illustrating a multi-chip package in accordance with example embodiments;

A multi-chip package 100c of this example embodiment may include elements substantially the same as those of the multi-chip package 100a in FIG. 34 except for further including a package substrate 210, a molding member 220 and an external terminal 230. Thus, the same reference numerals refer to the same elements and any further illustrations with respect to the same elements are omitted herein for the sake of brevity.

Referring to FIG. 36, the multi-chip package 100c in FIG. 36 may be positioned over the package substrate 210. Particularly, the connecting terminal 200a connected to the first seed layer 171 or the first plug 181 may be oriented toward the package substrate 210. Thus, the multi-chip package 100c may correspond to a face-up type package where active surfaces of the first, second and the third semiconductor chips 110, 120 and 130, respectively, on which the first, second third bonding pads 112, 122 and 132 may be arranged may be oriented upwardly. The connecting terminal 200a may be mounted on an upper surface of the package substrate 210. The connecting terminal 200a may electrically make contact with a circuit pattern (not shown) of the package substrate 210.

The molding member 220 may be formed on the upper surface of the package substrate 210 to cover the insulating layer structure. In example embodiments, the molding member 220 may protect the first semiconductor chip 110, the second semiconductor chip 120 and the third semiconductor chip 130 from external environments. The molding member 220 may include an epoxy molding compound (EMC).

The external terminal 230 may be mounted on a lower surface of the package substrate 210. The external terminal 230 may electrically make contact with the circuit pattern of the package substrate 210. In example embodiments, the external terminal 230 may include a solder ball.

A method of manufacturing the multi-chip package 100c may include processes substantially the same as processes for manufacturing the multi-chip package 100a in FIG. 34 except for further including a process for mounting the connecting terminal 200 on the package substrate 210, a process for forming the molding member 220 on the upper surface of the package substrate 210, and a process for mounting the external terminal on the lower surface of the package substrate 210. Thus, any further illustrations with respect to the method of manufacturing the multi-chip package 100c are omitted herein for the sake of brevity.

In example embodiments, the multi-chip packages may include the three semiconductor chips. Alternatively, the multi-chip packages may include two semiconductor chips or at least four semiconductor chips.

According to example embodiments, the plug structure arranged along the side surfaces of the semiconductor chips may be formed by the simple plating process. Thus, performing a process for forming a micro bump between the plugs is not required. As a result, the multi-chip package does not have problems associated with the process for forming the micro bump.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a multi-chip package, the method comprising:
    arranging a second semiconductor chip having a second bonding pad over a first semiconductor chip having a first bonding pad;
    forming an insulating layer structure to cover side surfaces and upper surfaces of the first semiconductor chip and the second semiconductor chip; and
    forming a plug structure in the insulating layer structure by a plating process, the plug structure being spaced apart from the side surfaces of the first semiconductor chip and the second semiconductor chip to electrically connect the first bonding pad with the second bonding pad;
    wherein the forming the insulating layer structure and forming the plug structure further comprise:
    forming a first seed layer on a supporting substrate;
    attaching the first semiconductor chip to the first seed layer;
    forming a first insulating layer pattern on the first seed layer to cover the first semiconductor chip;
    forming a first opening in the first insulating layer pattern; exposing the first bonding pad;
    forming a first via hole in the first insulating layer pattern; exposing the first seed layer;
    performing a first planting process on the first seed layer;
    forming a first plug on the first via hole;
    forming a second seed layer from the first plug to the first bonding pad;
    performing a second planting process on the second seed layer to form a first redistribution layer connected between the first plug and the first bonding pad;
    forming a second insulating layer pattern on the first insulating pattern;
    attaching the second semiconductor chip to the second insulating layer pattern;
    forming a third insulating layer pattern on the second insulatin layer pattern to cover the second semiconductor chip;
    forming a second via hole in the third insulatin layer pattern;
    exposing the first redistribution layer;
    forming a second opening in the third insulating pattern;
    exposing the second bonding pad;
    performing a third plating process on the first redistribution layer to form a second plug in the second via hole;
    forming a third seed layer from the second plug to the second bonding pad;
    performing a fourth plating process on the third seed layer to form a second redistribution layer connected between the second plug and the second bonding pad; and
    forming a fourth insulating layer pattern on the third insulating layer pattern to expose the second redistribution layer;
    the method further comprising:
    arranging a third semiconductor chip having a third bonding pad over the second semiconductor chip having the second bonding pad;
    wherein forming an insulating layer structure further comprises forming an insulating layer structure to cover side surfaces and an upper surface of the third semiconductor chip; and
    wherein electrically connecting further comprises electrically connecting the second bonding pad with the third bonding pad;
    wherein forming the insulating layer structure and forming the plug structure further comprise:
    attaching the third semiconductor chip the fourth insulating layer pattern to cover the third semiconductor chip;
    forming a third via hole in the fifth insulating layer pattern;
    exposing the second redistribution layer;
    forming a third opening in the fifth insulating layer pattern;
    exposing the third bonding pad;
    performing a fifth plating process on the second redistribution ayer;
    forming a third plug in the third via hole;
    forming a fourth seed layer from the third plug to the third bonding pad;
    performing a sixth plating process on the fourth seed layer;
    forming a third redistribution layer connected between the third plug and the third bonding pad; and
    forming a sixth insulating layer pattern on the fifth insulating layer pattern.

2. The method of claim 1, further comprising forming a connecting terminal on the second redistribution layer.

3. The method of claim 1, further comprising forming a connecting terminal on the first seed layer.

4. The method of claim 1, further comprising:
    forming a connecting terminal on the plug structure; and
    mounting the connecting terminal on a package substrate.

5. The method of claim 4, further comprising:
    forming a molding member on an upper surface of the package substrate to cover the insulating layer structure; and
    mounting an external terminal on a lower surface of the package substrate.

* * * * *